US012631966B2

(12) United States Patent
Namgung et al.

(10) Patent No.: US 12,631,966 B2
(45) **Date of Patent: *May 19, 2026**

(54) METHOD FOR FORMING PHOTORESIST PATTERNS

(71) Applicants: SAMSUNG SDI CO., LTD., Yongin-si (KR); SAMSUNG ELECTRONICS CO., LTD., Suwon (KR)

(72) Inventors: Ran Namgung, Suwon-si (KR); Shinhyo Bae, Suwon-si (KR); Hyeon Park, Suwon-si (KR); Daeseok Song, Suwon-si (KR); Minki Chon, Suwon-si (KR); Jun Soo Kim, Hwaseong-si (KR); Hyun-Woo Kim, Seongnam-si (KR); Hyun-Ji Song, Anyang-si (KR); Young Joo Choi, Hwaseong-si (KR); Suk-Koo Hong, Hwaseong-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 779 days.

This patent is subject to a terminal disclaimer.

(21) Appl. No.: 17/733,743

(22) Filed: Apr. 29, 2022

(65) Prior Publication Data

US 2023/0026579 A1 Jan. 26, 2023

(30) Foreign Application Priority Data

Jul. 1, 2021 (KR) ........................ 10-2021-0086512

(51) Int. Cl.

| | |
|---|---|
| ***G03F 7/11*** | (2006.01) |
| ***C08F 220/28*** | (2006.01) |
| ***C09D 133/16*** | (2006.01) |
| ***H01L 21/02*** | (2006.01) |
| ***H01L 21/311*** | (2006.01) |
| ***H10P 50/28*** | (2026.01) |
| ***H10P 76/20*** | (2026.01) |

(52) U.S. Cl.

CPC ............ *G03F 7/11* (2013.01); *C08F 220/282* (2020.02); *C09D 133/16* (2013.01); *H10P 50/287* (2026.01); *H10P 76/2041* (2026.01); *H10P 76/2042* (2026.01)

(58) Field of Classification Search

None

See application file for complete search history.

(56) References Cited

U.S. PATENT DOCUMENTS

| | | | | |
|---|---|---|---|---|
| 6,764,806 | B2 | 7/2004 | Jung et al. | |
| 7,214,467 | B2 | 5/2007 | Kanna et al. | |
| 2005/0284502 | A1 | 12/2005 | Watanabe et al. | |
| 2006/0111550 | A1 | 5/2006 | Hata et al. | |
| 2006/0127803 | A1 | 6/2006 | Jung et al. | |
| 2006/0275697 | A1 | 12/2006 | Hata et al. | |
| 2007/0031755 | A1 | 2/2007 | Hirayama et al. | |
| 2007/0087125 | A1 | 4/2007 | Maeda et al. | |
| 2007/0178407 | A1 | 8/2007 | Hatakeyama et al. | |
| 2010/0003615 | A1 | 1/2010 | Nakamura et al. | |
| 2010/0104978 | A1 | 4/2010 | Sawano et al. | |
| 2010/0266953 | A1 | 10/2010 | Chiba et al. | |
| 2011/0123933 | A1 | 5/2011 | Yun et al. | |
| 2013/0244438 | A1 | 9/2013 | Bae et al. | |
| 2015/0004544 | A1 | 1/2015 | Namai | |
| 2015/0086929 | A1* | 3/2015 | Hatakeyama | G03F 7/325 524/378 |
| 2015/0185620 | A1* | 7/2015 | Liu | G03F 7/0392 430/319 |
| 2016/0097979 | A1* | 4/2016 | Tsunoda | H01L 21/0274 430/326 |
| 2016/0202612 | A1* | 7/2016 | Hatakeyama | C08F 212/20 430/296 |
| 2017/0170008 | A1* | 6/2017 | Park | C09D 125/08 |
| 2017/0255102 | A1* | 9/2017 | Rowell | G03F 7/30 |
| 2017/0255103 | A1 | 9/2017 | Rowell et al. | |
| 2017/0293227 | A1 | 10/2017 | Nishita et al. | |
| 2018/0188654 | A1 | 7/2018 | Rowell et al. | |
| 2019/0146342 | A1 | 5/2019 | Zi et al. | |
| 2019/0243246 | A1 | 8/2019 | Kaur et al. | |

(Continued)

FOREIGN PATENT DOCUMENTS

| | | | | |
|---|---|---|---|---|
| CN | 103186038 A | * | 7/2013 | G03F 7/38 |
| CN | 103258720 A | * | 8/2013 | G03F 7/0392 |

(Continued)

OTHER PUBLICATIONS

Korean Office Action issued in corresponding KR Application No. 10-2021-0086512, dated Mar. 29, 2024, 7 pages.
Korean Office Action dated Mar. 29, 2024, of the corresponding Korean Patent Application No. 10-2021-0086511 (7 pages).
Korean Office Action dated Jul. 29, 2024, of the corresponding Korean Patent Application No. 10-2021-0086513 (7 pages).
Korean Office Action dated Aug. 1, 2024, of the corresponding Korean Patent Application No. 10-2021-0086530 (5 pages).
US Office Action dated Oct. 7, 2024, issued in U.S. Appl. No. 17/749,899 (9 pages).

(Continued)

*Primary Examiner* — Martin J Angebranndt
(74) *Attorney, Agent, or Firm* — Womble Bond Dickinson (US) LLP

(57) ABSTRACT

A method of forming a photoresist pattern and a semiconductor device on which a photoresist pattern manufactured according to the same is formed. The method includes forming a photoresist pattern on a substrate; coating an organic topcoat composition including an acrylic polymer including a structural unit containing a hydroxy group and a fluorine and an acidic compound on the photoresist pattern; drying and heating the substrate on which the organic topcoat composition is coated to coat it with a topcoat; and spraying a rinse solution including an ether-based compound on the substrate coated with the topcoat to remove the topcoat.

13 Claims, 1 Drawing Sheet

(56) References Cited

U.S. PATENT DOCUMENTS

| | | | |
|---|---|---|---|
| 2020/0192220 A1 | 6/2020 | Yagi et al. | |
| 2020/0319551 A1 | 10/2020 | Tsuchimura et al. | |
| 2020/0379353 A1* | 12/2020 | Kaur | G03F 7/40 |
| 2021/0055653 A1 | 2/2021 | Yoshimura et al. | |
| 2023/0021469 A1* | 1/2023 | Namgung | C09D 133/16 |
| 2023/0024422 A1* | 1/2023 | Namgung | C07C 53/23 |
| 2023/0026721 A1* | 1/2023 | Namgung | G03F 7/405 |
| 2023/0028244 A1 | 1/2023 | Namgung et al. | |
| 2023/0032354 A1* | 2/2023 | Namgung | C08F 120/24 |

FOREIGN PATENT DOCUMENTS

| | | | | |
|---|---|---|---|---|
| CN | 104749888 A | * | 7/2015 | G03F 7/0392 |
| JP | 9-291228 A | | 11/1997 | |
| JP | 2005-157259 A | | 6/2005 | |
| JP | 2006-23699 A | | 1/2006 | |
| JP | 2006-58404 A | | 3/2006 | |
| JP | 2008-286924 A | | 11/2008 | |
| JP | 2009-145658 A | | 7/2009 | |
| JP | 2010-275498 A | | 12/2010 | |
| JP | 2011-17921 A | | 1/2011 | |
| JP | 2012-68628 A | | 4/2012 | |
| JP | 2013218191 A | * | 10/2013 | |
| JP | 5381298 B2 | | 1/2014 | |
| JP | 5617810 B2 | | 11/2014 | |
| JP | 6525389 B2 | | 6/2019 | |
| JP | 6818731 B2 | | 1/2021 | |
| JP | 6823992 B2 | | 2/2021 | |
| KR | 10-2001-0089151 A | | 9/2001 | |
| KR | 10-0574496 B1 | | 4/2006 | |
| KR | 10-2006-0049679 A | | 5/2006 | |
| KR | 10-0574993 B1 | | 5/2006 | |
| KR | 10-2006-0064054 A | | 6/2006 | |
| KR | 10-0640643 B1 | | 10/2006 | |
| KR | 10-2007-0041287 A | | 4/2007 | |
| KR | 10-2008-0099913 A | | 11/2008 | |
| KR | 10-2009-0106562 A | | 10/2009 | |
| KR | 10-0926021 B1 | | 11/2009 | |
| KR | 10-0962951 B1 | | 6/2010 | |
| KR | 10-2010-0098024 A | | 9/2010 | |
| KR | 10-2011-0009005 A | | 1/2011 | |
| KR | 10-2011-0056153 A | | 5/2011 | |
| KR | 10-1112599 B1 | | 2/2012 | |
| KR | 10-2012-0111532 A | | 10/2012 | |
| KR | 10-1384811 B1 | | 4/2014 | |
| KR | 10-1428121 B1 | | 8/2014 | |
| KR | 10-2014-0120212 A | | 10/2014 | |
| KR | 10-1486843 B1 | | 1/2015 | |
| KR | 10-2015-0080434 A | | 7/2015 | |
| KR | 10-2017-0007185 A | | 1/2017 | |
| KR | 10-1807198 B1 | | 12/2017 | |
| KR | 10-1910832 B1 | | 10/2018 | |
| KR | 10-1940003 B1 | | 1/2019 | |
| KR | 10-2029693 B1 | | 10/2019 | |
| KR | 10-2069186 B1 | | 1/2020 | |
| KR | 10-2100432 B1 | | 5/2020 | |
| KR | 10-2020-0138007 A | | 12/2020 | |
| KR | 10-2195470 B1 | | 12/2020 | |
| KR | 10-2203366 B1 | | 1/2021 | |
| WO | WO 2008/035640 A1 | | 3/2008 | |
| WO | 2012/064097 A2 | | 5/2012 | |
| WO | 2019/054311 A1 | | 3/2019 | |
| WO | 2019/026549 A1 | | 7/2019 | |

OTHER PUBLICATIONS

US Office Action dated Dec. 4, 2024, issued in U.S. Appl. No. 17/734,772 (21 pages).
US Office Action dated Feb. 7, 2025, issued in U.S. Appl. No. 17/847,794 (16 pages).
US Office Action dated Mar. 13, 2025, issued in U.S. Appl. No. 17/746,811 (20 pages).
US Office Action dated May 7, 2025, issued in U.S. Appl. No. 17/742,260 (10 pages).
US Notice of Allowance dated Jun. 9, 2025, issued in U.S. Appl. No. 17/734,772 (10 pages).
US Notice of Allowance dated Aug. 14, 2025, issued in U.S. Appl. No. 17/742,260 (8 pages).
US Final Office Action dated Aug. 22, 2025, issued in U.S. Appl. No. 17/847,794 (23 pages).
US Final Office Action dated Sep. 17, 2025, issued in U.S. Appl. No. 17/746,811 (18 pages).
US Notice of Allowance dated Oct. 16, 2025, issued in U.S. Appl. No. 17/734,772 (11 pages).

* cited by examiner

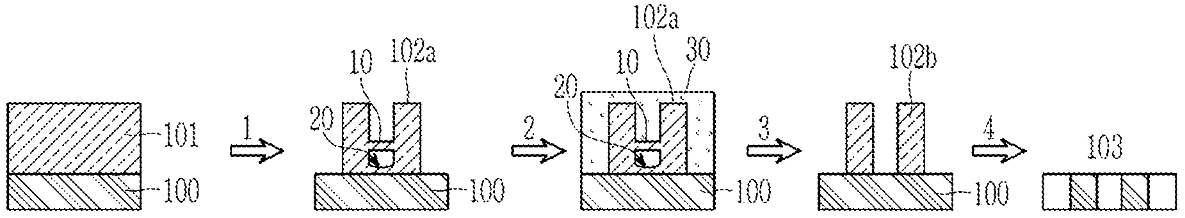
101
100
1
10
102a
20
100
2
102a
10
30
20
100
3
102b
100
4
103

METHOD FOR FORMING PHOTORESIST PATTERNS

CROSS-REFERENCE TO RELATED APPLICATION

This application claims priority to and the benefit of Korean Patent Application No. 10-2021-0086512, filed in the Korean Intellectual Property Office on Jul. 1, 2021, the entire content of which is incorporated herein by reference.

BACKGROUND

1. Field

The present disclosure relates to a method for forming photoresist patterns, specifically, to a pattern processing method utilizing a pattern treatment composition.

2. Description of the Related Art

Recently, the semiconductor industry has developed an ultrafine technique with a pattern of several to several tens nanometer in size (e.g., in nanometer size). Such ultrafine technique relies on (or essentially needs) effective lithographic techniques.

A typical lithographic technique involves forming a material layer on a semiconductor substrate, coating a photoresist layer thereon, exposing and developing the photoresist layer to form a photoresist pattern, and then etching the material layer utilizing the photoresist pattern as a mask.

As lithographic techniques are developed, a degree of pattern integration is increasing, and materials and technologies for solving various problems occurring in this process are desired or required. For example, when photoresist is patterned utilizing extreme ultraviolet (EUV) as a light source, a high-resolution pattern may be realized, but single line open (SLO) defects may occur randomly on the pattern due to photon shot noise. These SLO defects may lower yield, and thus improved technology solutions are desired.

SUMMARY

An aspect according to one or more embodiments is directed toward a method for forming photoresist patterns capable of not only realizing high-resolution patterns, but also removing single line open (SLO) defects to improve yield.

Another aspect according to one or more embodiments is directed toward a semiconductor device manufactured by the method for forming photoresist patterns. According to an embodiment, a method for forming photoresist patterns includes forming a first photoresist pattern on a substrate; coating an organic topcoat composition on the photoresist pattern, the organic topcoat composition including an acidic compound and an acrylic polymer including a structural unit containing a hydroxy group and a fluorine; drying and heating the substrate on which the organic topcoat composition is coated to form a topcoat; and spraying a rinse solution including an ether-based compound on the substrate coated with the topcoat to remove the topcoat.

The structural unit containing the hydroxy group and fluorine may be represented by Chemical Formula 1.

Chemical Formula 1

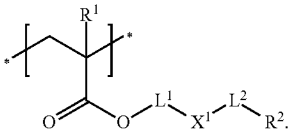

In Chemical Formula 1, $R^1$ is hydrogen or a substituted or unsubstituted C1 to C10 alkyl group, $R^2$ is hydrogen, a fluorine, a hydroxy group, or a substituted or unsubstituted C1 to C20 alkyl group, $L^1$ and $L^2$ are each independently a single bond or a substituted or unsubstituted C1 to C10 alkylene group, $X^1$ is a single bond, —O—, —S—, —S(O)—, $—S(O)_2—$, —C(O)—, —(CO)O—, —O(CO), —O(CO)O—, or —NR'—, wherein R' is hydrogen, deuterium, or a C1 to C10 alkyl group), $R^2$, $L^1$, and $L^2$ together include a fluorine and a hydroxy group, and

* is a linking point.

In some embodiments, the structural unit containing the hydroxy group and fluorine may be represented by Chemical Formula 2.

Chemical Formula 2

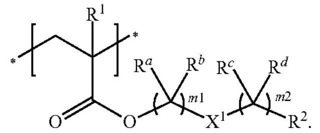

In Chemical Formula 2, $R^1$ is hydrogen or a substituted or unsubstituted C1 to C10 alkyl group, $R^a$, $R^b$, $R^c$, $R^d$, and $R^2$ are each independently hydrogen, a fluorine, a hydroxy group, or a substituted or unsubstituted C1 to C20 alkyl group, m1 and m2 are each independently an integer from 1 to 10, $X^1$ is a single bond, —O—, —S—, —S(O)—, $—S(O)_2—$, —C(O)—, —(CO)O—, —O(CO), —O(CO)O—, or —NR'—, wherein R' is hydrogen, deuterium, or a C1 to C10 alkyl group, and $R^a$, $R^b$, $R^c$, $R^d$, and $R^2$ together include a fluorine and a hydroxy group.

In some embodiments, the structural unit containing the hydroxy group and fluorine may be selected from Group I.

Group I

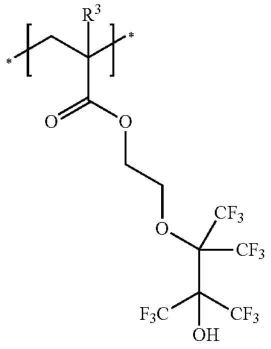

-continued

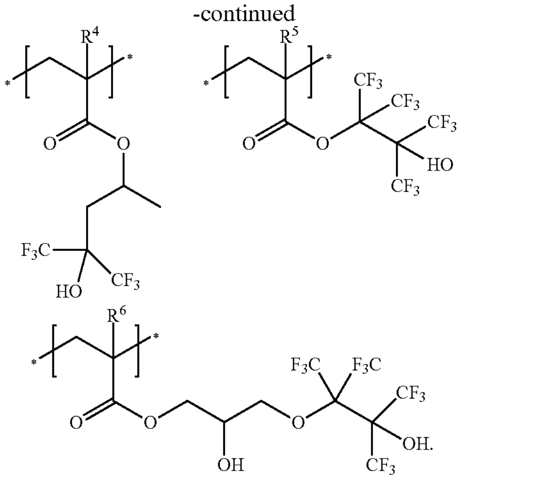

In Group I, $R^3$ to $R^6$ are each independently hydrogen or a methyl group, and * is a linking point.

A weight average molecular weight of the acrylic polymer may be about 1,000 g/mol to about 50,000 g/mol.

The acidic compound may be at least one selected from a sulfonic acidic compound containing at least one fluorine, a sulfonimide compound containing at least one fluorine, and a carboxylic acidic compound containing at least one fluorine.

The acidic compound may be at least one of the compounds represented by Chemical Formula 3 to Chemical Formula 6.

Chemical Formula 3

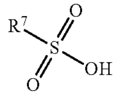

Chemical Formula 4

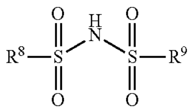

Chemical Formula 5

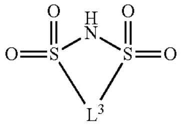

Chemical Formula 6

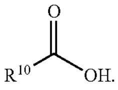

In Chemical Formula 3 to Chemical Formula 6, $R^7$ to $R^{10}$ are each independently a fluorine, a C1 to C20 alkyl group substituted with at least one fluorine, a C2 to C20 alkenyl group substituted with at least one fluorine, a C2 to C20 alkynyl group substituted with at least one fluorine, a C3 to C20 cycloalkyl group substituted with at least one fluorine, a C3 to C20 cycloalkenyl group substituted with at least one fluorine, a C3 to C20 cycloalkynyl group substituted with at least one fluorine, a C6 to C20 aryl group substituted with at least one fluorine, or a C1 to C20 heteroaryl group substituted with at least one fluorine, and $L^3$ is a C1 to C10 alkylene group substituted with at least one fluorine, a C3 to C20 cycloalkylene group substituted with at least one fluorine, a C6 to C20 arylene group substituted with at least one fluorine, or a C1 to C20 heteroarylene group substituted with at least one fluorine.

The acidic compound may be at least one of the compounds of Group I.

Group II

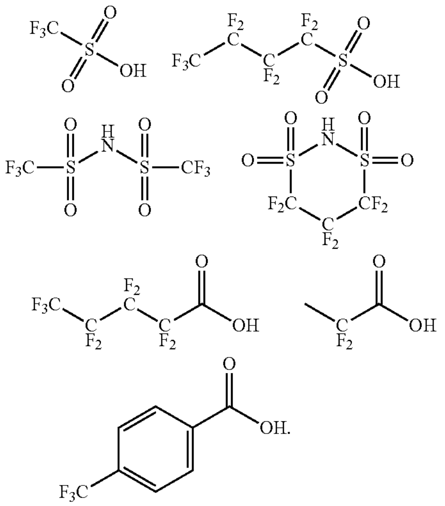

The acrylic polymer and the acidic compound may be included in a weight ratio of about 3:1 to about 30:1.

A total weight of the acrylic polymer and the acidic compound may be about 0.1 wt % to about 10 wt % based on a total weight of the organic topcoat composition.

The rinse solution may further include an alcohol-based compound.

The rinse solution may include the ether-based compound and the alcohol-based compound in a weight ratio of about 0.5:1 to about 20:1.

The ether-based compound may be represented by Chemical Formula 7.

Chemical Formula 7

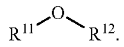

In Chemical Formula 7, $R^{11}$ and $R^{12}$ are each independently a substituted or unsubstituted C3 to C20 alkyl group.

The ether-based compound may be selected from:

diisopropyl ether, dipropyl ether, diisoamyl ether, diamyl ether, dibutyl ether, diisobutyl ether, di-sec-butyl ether, dihexyl ether, bis(2-ethylhexyl) ether, didecyl ether, diundecyl ether, didodecyl ether, ditetradecyl ether, hexadecyl ether, butylmethyl ether, butylethyl ether, butylpropyl ether, tert-butylmethyl ether, tert-butylethyl ether, tert-butylpropyl ether, di-tert-butyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, 2-octanone, 4-heptanone, and a combination thereof.

According to another embodiment, a semiconductor device includes a substrate, and the photoresist pattern manufactured according to the aforementioned method for forming photoresist patterns.

The method for forming photoresist patterns may be capable of effectively removing the SLO defects without loss of the photoresist fine pattern.

In addition, it is desirable in terms of process economy by introducing a relatively simple post-treatment method without utilizing expensive materials and complicated process processes.

Accordingly, the method for forming photoresist patterns according to the embodiment may be desirably utilized for forming a fine pattern of a photoresist utilizing a high energy light source such as EUV.

BRIEF DESCRIPTION OF THE DRAWING

The drawing is a cross-sectional view for explaining a method of forming photoresist patterns according to an embodiment.

DETAILED DESCRIPTION

Example embodiments of the present disclosure will hereinafter be described in more detail, and may be easily performed by a person skilled in the art. However, this disclosure may be embodied in many different forms and should not be construed as limited to the example embodiments set forth herein.

In the drawings, the thickness of layers, films, panels, regions, etc., may be exaggerated for clarity and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to replacement of a hydrogen atom of a compound or a moiety by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C6 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, the term "hetero" refers to a compound or a moiety that includes 1 to 10 heteroatoms selected from nitrogen (N), oxygen (O), sulfur (S), and phosphorus (P).

In addition, in the present specification, the term "acrylic polymer" refers to an acrylic polymer and a methacrylic polymer.

Unless otherwise specified in the present specification, the weight average molecular weight is measured by dissolving a powder sample in tetrahydrofuran (THF) and then utilizing 1200 series Gel Permeation Chromatography (GPC) of Agilent Technologies (column is Shodex Company LF-804, standard sample is Shodex company polystyrene).

In addition, unless otherwise defined in the specification, "*" indicates a linking point of a structural unit or a moiety of a compound.

Hereinafter, a resist topcoat composition according to an embodiment is described in more detail.

The present disclosure relates to a resist topcoat composition capable of improving photoresist patterning by adding a simple process during the fine pattern forming process of photolithography utilizing a short-wavelength light source such as an ArF excimer laser (wavelength: 193 nm) or high energy rays such as extreme ultraviolet (EUV; wavelength: 13.5 nm) to remove SLO defects remaining in the resist pattern, and a method for forming a photoresist pattern utilizing such a topcoat.

A method for forming photoresist patterns according to an example embodiment will be described with reference to the drawing.

A method for forming patterns according to an embodiment may include forming a photoresist pattern on a substrate (1), coating an organic topcoat composition including an acrylic polymer including a structural unit containing a hydroxy group and a fluorine and an acidic compound on the photoresist pattern, drying and heating the substrate on which the organic topcoat composition is coated to coat it with a topcoat (2), and spraying a rinse solution including an acetate-based compound on the substrate coated with the topcoat to remove the topcoat (3).

The forming of the photoresist pattern on the substrate (1) may include coating a semiconductor resist composition on the substrate 100 by spin coating, slit coating, and/or inkjet printing, forming a photoresist film 101 by drying and heating the coated semiconductor photoresist composition, and selectively exposing and developing the photoresist film 101 to dissolve and remove the photoresist layer corresponding to the exposed area to form a photoresist pattern (e.g., a preliminary photoresist pattern) 102*a*.

The forming of the preliminary photoresist pattern 102*a* may be performed by any suitable (e.g., known) method, and details thereof will be omitted.

In the preliminary photoresist pattern 102*a* formed in this way, the bridge 10 connected to the adjacent pattern and the scum 20 remaining in the gap between the patterns may occur, and these defects may cause SLO defects in the thin film pattern to be formed later to cause a decrease of yield.

In order to remove the bridge 10 and the scum 20 remaining after the formation of the photoresist pattern, the method for forming photoresist patterns according to an embodiment may include coating an organic topcoat composition including an acrylic polymer including a structural unit containing a hydroxy group and a fluorine and an acidic compound on the photoresist pattern, drying and heating the substrate coated with the organic topcoat composition to form a topcoat 30 (2), and spraying a rinse solution including an ether-based compound on the substrate coated with the topcoat to remove the topcoat (3).

The organic topcoat composition may include an acrylic polymer, and the acrylic polymer may include a structural unit containing a hydroxy group and fluorine.

For example, the structural unit containing the hydroxy group and fluorine may be represented by Chemical Formula 1.

Chemical Formula 1

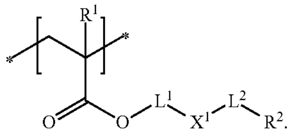

In Chemical Formula 1, $R^1$ is hydrogen or a substituted or unsubstituted C1 to C10 alkyl group, $R^2$ is hydrogen, a fluorine, a hydroxy group, or a substituted or unsubstituted C1 to C20 alkyl group, $L^1$ and $L^2$ are each independently a single bond, or a substituted or unsubstituted C1 to C10 alkylene group, $X^1$ is a single bond, —O—, —S—, —S(O)—, —$S(O)_2$—, —C(O)—, —(CO)O—, —O(CO), —O(CO)O—, or —NR'—, wherein, R' is hydrogen, deuterium, or a C1 to C10 alkyl group, $R^2$, $L^1$, and $L^2$ together include a fluorine and a hydroxy group, and

* is a linking point.

The descriptions that $R^2$, $L^1$, and $L^2$ together include a fluorine and a hydroxy group may refer to that $R^2$ is a C1 to C10 alkyl group substituted with at least one fluorine and at least one hydroxy group, at least one of $L^1$ or $L^2$ is a C1 to C10 alkylene group substituted with at least one fluorine and at least one hydroxy group, at least one of $L^1$ or $L^2$ is a C1 to C10 alkylene group substituted with at least one fluorine and the other is a C1 to C10 allylene group substituted with at least one hydroxy group, $R^2$ is a fluorine and at least one of $L^1$ or $L^2$ is a C1 to C10 alkylene group substituted with a hydroxy group, $R^2$ is a hydroxy group and at least one of $L^1$ or $L^2$ is a C1 to C10 alkylene group substituted with a fluorine, $R^2$ is a C1 to C10 alkyl group substituted with at least one fluorine and at least one hydroxy group, or $R^2$ is a C1 to C20 alkyl group substituted with at least one hydroxy group and at least one fluorine.

In some embodiments, the acrylic polymer may include a structural unit represented by Chemical Formula 2.

Chemical Formula 2

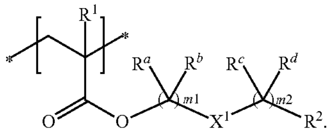

In Chemical Formula 2, $R^1$ is hydrogen or a substituted or unsubstituted C1 to C10 alkyl group, $R^a$, $R^b$, $R^c$, $R^d$, and $R^2$ are each independently hydrogen, a fluorine, a hydroxy group, or a substituted or unsubstituted C1 to C20 alkyl group, m1 and m2 are each independently an integer from 1 to 10, $X^1$ is a single bond, —O—, —S—, —S(O)—, —$S(O)_2$—, —C(O)—, —(CO)O—, —O(CO), —O(CO)O—, or —NR'—, wherein R' is hydrogen, deuterium, or a C1 to C10 alkyl group, $R^a$, $R^b$, $R^c$, $R^d$, and $R^2$ together include a fluorine and a hydroxy group, and

* is a linking point.

The descriptions that $R^a$, $R^b$, $R^c$, $R^d$, and $R^2$ together include a fluorine and a hydroxy group refers to that at least one of $R^a$, $R^b$, $R^c$, $R^d$, or $R^2$ is each independently a fluorine, and at least one of the other (the remaining groups) is each independently a hydroxy group, or at least one of $R^a$, $R^b$, $R^c$, $R^d$, or $R^2$ is each independently a C1 to C10 alkyl group substituted with a fluorine and at least one of the other (the remaining groups) is each independently a C1 to C10 alkyl group substituted with a hydroxy group, at least one of $R^a$, $R^b$, $R^c$, $R^d$, or $R^2$ is each independently a C1 to C10 alkyl group substituted with a hydroxy group and a fluorine, at least one of $R^a$, $R^b$, $R^c$, $R^d$, or $R^2$ is each independently a C1 to C20 alkyl group substituted with a hydroxy group and a fluorine, at least one of $R^a$, $R^b$, $R^c$, $R^d$, or $R^2$ is a fluorine and at least one of the other is a C1 to C10 alkyl group substituted with a hydroxy group, at least one of $R^a$, $R^b$, $R^c$, $R^d$, or $R^2$ is a hydroxy group and at least one of the other is a C1 to C10 alkyl group substituted with a fluorine, or at least one of $R^a$, $R^b$, $R^c$, $R^d$, or $R^2$ is a C1 to C20 alkyl group substituted with a fluorine and at least one of the other is a C1 to C20 alkyl group substituted with a hydroxy group.

In some embodiments, $R^1$ may be hydrogen or a methyl group, $X^1$ may be a single bond or —O—, and $R^2$ may be a fluorine, a hydroxy group, a C1 to C10 alkyl group substituted with at least one fluorine or a C1 to C10 alkyl group substituted with at least one hydroxy group.

In some embodiments, $R^c$, $R^d$, and $R^2$ of Chemical Formula 2 may together include a fluorine and a hydroxy group.

In an embodiment, at least one of $R^c$ or $R^d$ in Chemical Formula 2 may be a fluorine or a C1 to C10 alkyl group substituted with at least one fluorine, and $R^2$ may be a hydroxy group or a C1 to C10 alkyl group substituted with at least one hydroxy group.

In an embodiment, at least one of $R^c$ or $R^d$ in Chemical Formula 2 may be a hydroxy group or a C1 to C10 alkyl group substituted with at least one hydroxy group, and $R^2$ may be a fluorine or a C1 to C10 alkyl group substituted with at least one fluorine.

In an embodiment, in Chemical Formula 2, $R^c$ may be a hydroxy group or a C1 to C10 alkyl group substituted with at least one hydroxy group, $R^d$ may be a fluorine or a C1 to C10 alkyl group substituted with at least one fluorine, and $R^2$ may be a hydroxy group, a fluorine or a C1 to C10 alkyl group substituted with at least one fluorine or at least one hydroxy group.

In an embodiment, at least one of $R^c$ or $R^d$ of Chemical Formula 2 may be a fluorine or a C1 to C10 alkyl group substituted with at least one fluorine, $R^2$ may be a hydroxy group, or a C1 to C10 alkyl group substituted with at least one hydroxy group and at least one fluorine.

For example, the structural unit containing the hydroxy group and fluorine may be selected from Group I.

Group I

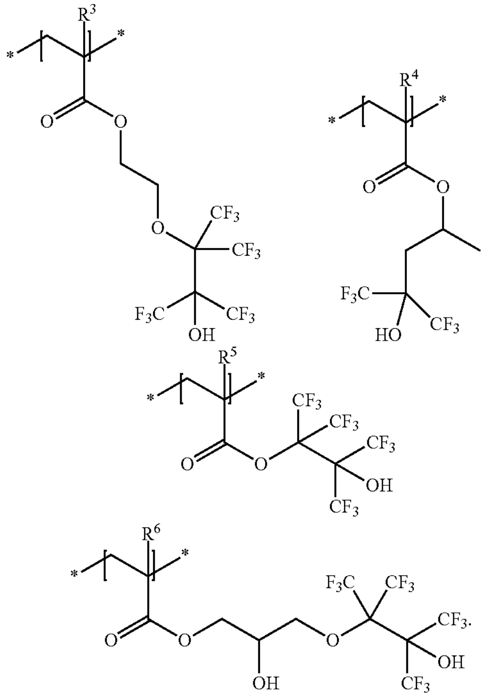

In Group I, $R^3$ to $R^6$ are each independently hydrogen or a methyl group, and * is a linking point.

Because the acrylic polymer includes the structural unit containing the hydroxy group and fluorine at the same time, it has suitable or excellent solubility in an organic solvent, may be uniformly coated on a pattern, and may reduce or minimize the influence on the photoresist.

The acrylic polymer may have a weight average molecular weight (Mw) of about 1,000 g/mol to about 50,000 g/mol. For example, it may have a weight average molecular weight of about 2,000 g/mol to about 30,000 g/mol, about 3,000 g/mol to about 20,000 g/mol, or about 4,000 g/mol to about 10,000 g/mol, but the present disclosure is not limited thereto. When the weight average molecular weight of the acrylic polymer is within the above ranges, a carbon content and solubility in a solvent of the organic topcoat composition may be desirable or optimized.

In addition, the organic topcoat composition includes an acidic compound and the acidic compound may include at least one selected from a sulfonic acidic compound containing at least one fluorine, a sulfonimide compound containing at least one fluorine, and a carboxylic acidic compound containing at least one fluorine.

In some embodiments, the acidic compound may be a mixture including two kinds (e.g., types) of compounds. As a mixture including two kinds (e.g., types) of compounds, two kinds (e.g., types) of compounds selected from a sulfonic acidic compound containing at least one fluorine, and a sulfonimide compound containing at least one fluorine may be included in a weight ratio of about 1:0.1 to about 1:50. For example, the two kinds (e.g., types) of the acidic compounds may be included in a weight ratio of about 1:0.3 to about 1:40, about 1:0.3 to about 1:35, or about 1:1 to about 1:30.

As described above, when a mixture including two kinds (e.g., types) of acidic compounds is included, the defect portion of the resist (e.g., photoresist pattern) may be selectively removed.

Accordingly, according to an embodiment, a high-resolution pattern may be obtained with a high yield.

In some embodiments, the acidic compound may be at least one kind (e.g., type) of compounds represented by Chemical Formula 3 to Chemical Formula 6.

Chemical Formula 3

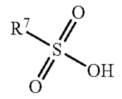

Chemical Formula 4

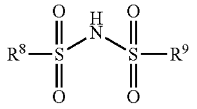

Chemical Formula 5

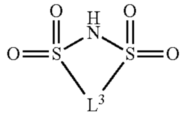

Chemical Formula 6

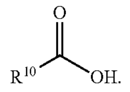

In Chemical Formula 3 to Chemical Formula 6, $R^7$ to $R^{10}$ are each independently a fluorine, a C1 to C20 alkyl group substituted with at least one fluorine, a C2 to C20 alkenyl group substituted with at least one fluorine, a C2 to C20 alkynyl group substituted with at least one fluorine, a C3 to C20 cycloalkyl group substituted with at least one fluorine, a C3 to C20 cycloalkenyl group substituted with at least one fluorine, a C3 to C20 cycloalkynyl group substituted with at least one fluorine, a C6 to C20 aryl group substituted with at least one fluorine, or a C1 to C20 heteroaryl group substituted with at least one fluorine, and $L^3$ is a C1 to C10 alkylene group substituted with at least one fluorine, a C3 to C20 cycloalkylene group substituted with at least one fluorine, a C6 to C20 arylene group substituted with at least one fluorine, or a C1 to C20 heteroarylene group substituted with at least one fluorine.

In an embodiment, $R^7$ to $R^{10}$ may each independently be a C1 to C10 alkyl group substituted with at least one fluorine, or a C6 to C20 aryl group substituted with at least one fluorine.

In an embodiment, the acidic compound may be at least one of the compounds of Group II.

Group II

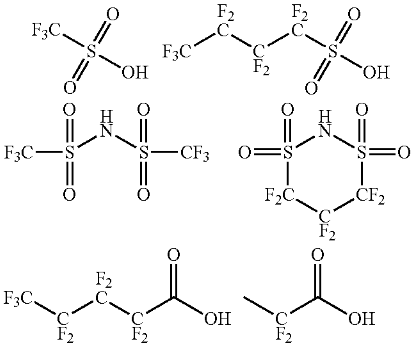

-continued

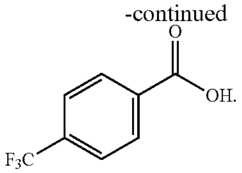

In some embodiments, the acrylic polymer and the acidic compound may be included in a weight ratio of about 3:1 to about 30:1, for example, about 5:1 to about 25:1, or about 5:1 to about 20:1.

By including the acrylic polymer and the acidic compound in the above weight ratios, an organic topcoat that is easy for SLO defect removal may be provided.

A total weight of the acrylic polymer and the acidic compound may be about 0.1 wt % to about 10 wt % based on the total weight of the organic topcoat composition. Within the above range, the organic topcoat may be easily removed.

In some embodiments, the organic topcoat composition may further include at least one other polymer selected from an epoxy-based resin, a novolac-based resin, a glycoluril-based resin, and a melamine-based resin, but the present disclosure is not limited thereto.

The organic topcoat composition may further include an additive including a surfactant, a thermal acid generator, a plasticizer, or a combination thereof.

The surfactant may be, for example, an alkylbenzene sulfonic acid salt, an alkylpyridinium salt, polyethylene glycol, a quaternary ammonium salt, and/or the like, but the present disclosure is not limited thereto.

The thermal acid generator may be, for example, an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carboxylic acid, benzointosylate, 2-nitrobenzyl tosylate, and/or other organic sulfonic acid alkyl esters, but the present disclosure is not limited thereto.

The additive may be included in an amount of about 0.001 to about 40 parts by weight based on 100 parts by weight of the organic topcoat composition. Within the above range, solubility may be improved without changing the optical properties of the organic topcoat composition.

Also, the organic topcoat composition may include an organic solvent having sufficient solubility or dispersibility with respect to the organic topcoat composition.

The organic solvent may be an ether-based compound and may be, for example, represented by Chemical Formula 7.

Chemical Formula 7

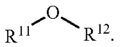

In Chemical Formula 7, $R^{11}$ and $R^{12}$ are each independently a substituted or unsubstituted C3 to C20 alkyl group.

For example, the ether-based compound may be selected from diisopropyl ether, dipropyl ether, diisoamyl ether, diamyl ether, dibutyl ether, diisobutyl ether, di-sec-butyl ether, dihexyl ether, bis(2-ethylhexyl) ether, didecyl ether, diundecyl ether, didodecyl ether, ditetradecyl ether, hexadecyl ether, butylmethyl ether, butylethyl ether, butylpropyl ether, tert-butylmethyl ether, tert-butylethyl ether, tert-butylpropyl ether, di-tert-butyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, 2-octanone, 4-heptanone, and a combination thereof.

The organic topcoat may be in a cured form, for example, by coating the organic topcoat composition on a photoresist pattern and then drying and heating the same.

The heating of the substrate on which the organic topcoat composition is coated may be performed at a temperature of about 100° C. to about 500° C.

In the spraying of the rinse solution on the substrate coated with the topcoat to remove the topcoat, the rinse solution may include a solvent having low reactivity with the photoresist and high solubility for the topcoat, and for example, the aforementioned ether-based compound may be utilized.

Examples of the ether-based compound included in the rinse solution are the same as described above.

The rinse solution may further include an alcohol-based compound in addition to the ether-based compound. In this case, the rinse solution may include the ether-based compound and the alcohol-based compound in a weight ratio of about 0.5:1 to about 20:1.

When a composition of the rinse solution is within the above range, it may have sufficient solubility and/or dispersibility in the organic topcoat composition while reducing or minimizing the effect on the photoresist.

In some embodiments, the rinse solution may include the ether-based compound and the alcohol-based compound in a weight ratio of about 1:1 to about 15:1, about 1:1 to about 10:1, or about 1:1 to about 9:1.

In some embodiments, the alcohol-based compound may be selected from methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol, n-decanol, ethylene glycol, diethylene glycol and triethylene glycol, ethylene glycol monomethyl ether, propylene glycol monomethyl ether, ethylene glycol monoethyl ether, propylene glycol monoethyl ether, diethylene glycol monomethyl ether, triethylene glycol mono ethyl ether, methoxymethyl butanol, ethyl lactate, methyl 2-hydroxy-2-methylpropionate, and a combination thereof.

As such, in the photoresist pattern **102*b* formed after performing the coating of the topcoat (2) and removing of the topcoat (3), the bridge 10 and the scum 20 may be removed compared with the photoresist pattern (e.g., a preliminary photoresist pattern) 102*a*** formed before performing the processes (2) and (3), so that the patterning of the photoresist may be improved.

The thin film pattern 103 may be finally formed through a process (4) of etching the exposed thin film of the substrate 100 by applying (e.g., utilizing) the photoresist pattern **102*b*** as an etching mask, and in the thin film pattern formed in this way, SLO defects may be effectively removed without loss of the fine pattern.

The method for forming photoresist patterns according to an embodiment is desirable (e.g., advantageous) in realizing high resolution because the SLO defects are easily removed.

Formation and removal of the organic topcoat may be performed by a simple process, which is desirable (e.g., advantageous) in terms of process economy, and the yield may be improved due to the removal of the SLO defects.

According to another embodiment, a photoresist pattern manufactured according to the aforementioned method for forming photoresist patterns is provided.

The thin film may be etched, for example, by dry etching utilizing an etching gas, and the etching gas may be, for example, $CHF_3$, $CF_4$, $Cl_2$, $BCl_3$, and a mixture thereof.

In the exposure process described above, the thin film pattern formed utilizing the photoresist pattern **102*b* that is formed by the exposure process performed utilizing the EUV light source may have a width corresponding to the photoresist pattern 102*b*. For example, the photoresist pattern 102*b* may have a width of about 5 nm to about 100 nm. For example, the thin film pattern 103 formed from the photoresist pattern 102*b* that is formed by the exposure process performed utilizing an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, about 5 nm to about 20 nm, the same as or similar to the photoresist pattern 102*b***, and may, for example, be formed in a width of less than or equal to about 20 nm.

Hereinafter, the present disclosure will be described in more detail through examples relating to the method of forming photoresist patterns. However, the present disclosure is not limited by the following examples.

SYNTHESIS EXAMPLES

Synthesis of Acrylic Polymer

Synthesis Example 1: Synthesis of Monomer 20 g (59.86 mmol) of hexafluoro-2,3-bis(trifluoromethyl)-2,3-butanediol(perfluoropinacol), 7.79 g (59.86 mmol) of 2-(hydroxyethyl)methacrylate, and 18.84 g (71.84 mmol) of triphenylphosphine ($Ph_3P$) were mixed in 110 ml of diethyl ether under a nitrogen atmosphere and then, stirred. After stirring for 30 minutes, the mixture was cooled down to 0° C., and another mixture of 14.52 g (71.84 mmol) of diisopropylazodicarboxylate (DIAD) and 35 ml of diethyl ether was slowly added thereto over 2 hours. Subsequently, the obtained mixture was stirred at room temperature for 24 hours and then, concentrated. The concentrated mixture was dissolved in dichloromethane and then, treated through column chromatography by utilizing silica gel to separate a synthesized material. The separated material was distilled under a reduced pressure, obtaining 2-[3,3,3-trifluoro-2-hydroxy-1,1,2-tris(trifluoromethyl)propoxy]ethyl 2-methyl-2-propenoate represented by Chemical Formula 1a.

*$^1$H-NMR (Acetone-d6): δ1.90 (3H, t), 4.36 (4H, m), 5.63 (1H, t), 6.09 (1H, t), 8.34 (1H, s)

* $^{19}$F-NMR (Acetone-d6): δ−70.12 (6F, m), −65.38 (6F, m)

Chemical Formula 1a

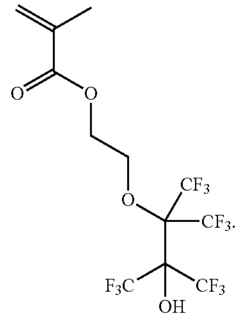

Synthesis Example 2: Preparation of Copolymer P1

The compound represented by Chemical Formula 1a (37.5 g, 84.0 mmol) according to Synthesis Example 1, dimethyl 2,2'-azobis(2-methylpropionate) (2.5 g, 10.9 mmol, Wako Chemical, Inc.), and diisoamyl ether (DIAE, 60 g) as monomers were put in a 500 ml 2-necked round flask under a nitrogen atmosphere, and a condenser was connected thereto. After increasing the temperature to 110° C., the obtained mixture was reacted for 24 hours, and the reaction solution was cooled down to room temperature. The reaction solution was dropped into a 1 L wide-mouth bottle containing 225 g of heptane, while stirred, producing gum, and then, a supernatant was removed therefrom. After dissolving the remaining gum in 40 g of DIAE, 180 g of heptane was added thereto to form precipitates, and a supernatant was removed therefrom, which was repeated three times to remove monomers and oligomers.

Finally, 22.5 g of a copolymer P1 including a structural unit represented by Chemical Formula 1 b (yield: 60% a weight average molecular weight: 4,500) was obtained.

Chemical Formula 1b

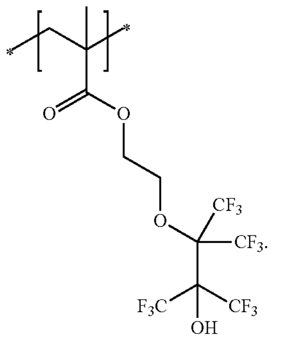

In Chemical Formula 1b, * is a linking point.

Example 1

2 g (4.3 wt %) of the copolymer P1 prepared in Synthesis Example 2, 0.04 g (0.09 wt %) of trifluoromethylsulfonic acid, and 0.10 g (0.22 wt %) of bis(trifluoromethanesulfonyl)imide were dissolved in 44.4 g (95.4 wt %) of diisoamyl ether and then stirred at room temperature (23° C.) for 24 hours to prepare an organic topcoat composition.

Each organic topcoat composition was spin coated on a silicon substrate coated with a photoresist and then, heat-treated on a hot plate at 110° C. for 1 minute, forming an organic topcoat with a thickness of about 50 nm. Thereafter, diisoamylether (DIAE) represented by Chemical Formula R1 was applied as a rinse solution to rinse it, and heat treatment was performed at 110° C. for 1 minute on a hot plate to form a photoresist pattern.

Chemical Formula R1

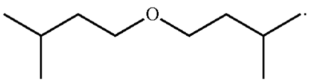

Examples 2 to 7

Each photoresist pattern was formed in the same manner as in Example 1, except that the rinse solution was changed as shown in Table 1.

Chemical Formula R2

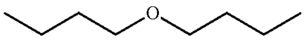

Chemical Formula R3

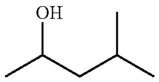

Chemical Formula R4

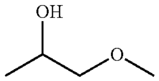

Chemical Formula R5

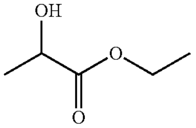

Chemical Formula R6

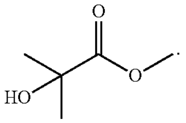

Comparative Examples 1 and 2

Without coating the organic topcoat composition and forming the organic topcoat, the corresponding rinse solution as described in Table 1 was applied directly on the silicon substrate coated with the photoresist to rinse it, and heat treatment was performed at 110° C. for 1 minute on a hot plate to form a photoresist pattern.

Chemical Formula R7

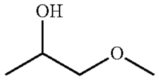

Chemical Formula R8

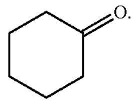

Evaluation 1: Evaluation of Non-Pattern Wafer (NPW) Strip

Thickness changes of the photoresists prepared according to Examples 1 to 7 and Comparative Examples 1 and 2 were measured and NPW strips were calculated according to the following equation, and the results are shown in Table 1.

NPW strip=PR thickness (nm) after rinsing−initial PR thickness (nm)

Evaluation 2: Evaluation of SLO Defect

On a 12 inch silicon substrate, a lower SiON film—a spin-on carbon film—a topcoat were sequentially formed. On the SiON film, a 1:1 line/space photoresist pattern with a pitch of 36 nm was formed in an EUV lithography method. The photoresist pattern was transferred into the lower SiON film through dry etching utilizing plasma. Then, all defects including bridge defects between the line patterns were inspected with a defect analysis equipment utilizing a deep UV (DUV) laser. The detected defects were classified by utilizing SEM, providing the number of the detected defects per unit area (ea/$cm^2$).

Herein, when the number of SLO defects without utilizing the organic topcoat compositions was converted into 100, '○' was given to a case that the number of defects was less than or equal to 80%, and 'X' was given to a case that the number of defects was greater than 80%.

TABLE 1

| | Composition of rinse solution | | | | | |
|---|---|---|---|---|---|---|
| | Ether-based compound | Alcohol-based compound | other compound | content ratio (wt %) | NPW strip (nm) | SLO Defects |
| Example 1 | R1 | — | — | — | −2.9 | ○ |
| Example 2 | R2 | — | — | — | −3.0 | ○ |
| Example 3 | R1 | R3 | — | 50:50 | −3.3 | ○ |
| Example 4 | R1 | R4 | — | 90:10 | −3.2 | ○ |
| Example 5 | R1 | R5 | — | 90:10 | −2.8 | ○ |
| Example 6 | R1 | R6 | — | 90:10 | −3.4 | ○ |
| Example 7 | R2 | R4 | — | 90:10 | −3.5 | ○ |
| Comparative Example 1 | — | R7 | — | — | −28.1 | ○ |
| Comparative Example 2 | — | — | R8 | — | −27.5 | ○ |

Referring to Table 1, the photoresist patterns prepared according to Examples 1 to 7, compared with the photoresist patterns prepared according to Comparative Examples 1 and 2, each exhibited improvement in NPW strip (effective when −5.0 nm to −2.5 nm) and improvement (e.g., elimination of) SLO defect.

As used herein, singular forms such as "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list. As used herein, the term "and/or" includes any and all combinations of one or more of the associated listed items.

The term "may" will be understood to refer to "one or more embodiments," some of which include the described element and some of which exclude that element and/or include an alternate element. Similarly, alternative language such as "or" refers to "one or more embodiments," each including a corresponding listed item.

As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, the certain embodiments of the present disclosure have been described and illustrated, however, it is apparent to a person with ordinary skill in the art that the present disclosure is not limited to the embodiment as described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims of the present disclosure, and equivalents thereof.

DESCRIPTION OF SOME OF THE SYMBOLS

1: forming a photoresist pattern on a substrate
2: coating a topcoat on the photoresist pattern
3: spraying a rinse solution on the substrate coated with the topcoat to remove the topcoat
4: etching the exposed thin film by applying the photoresist pattern as an etching mask 10: bridge 20: scum
30: topcoat
100: substrate 101: photoresist film
102*a*: preliminary photoresist pattern formed before performing coating and removing the topcoat
102*b*: photoresist pattern formed after performing coating and removing the topcoat 103: thin film pattern

What is claimed is:

1. A method for forming a photoresist pattern, the method comprising:

forming a first photoresist pattern on a substrate;

coating an organic topcoat composition on the photoresist pattern, the organic topcoat composition comprising an acidic compound and an acrylic polymer comprising a structural unit comprising a hydroxy group and a fluorine;

drying and heating the substrate on which the organic topcoat composition is coated to form a topcoat; and spraying a rinse solution consisting essentially of an ether-based compound or a combination of the ether-based compound and an alcohol-based compound ether-based compound on the substrate coated with the topcoat to remove the topcoat, wherein the acidic compound is a mixture of a sulfonic acidic compound comprising at least one fluorine and a sulfonimide compound comprising at least one fluorine, the sulfonic acidic compound comprising at least one fluorine is represented by Chemical Formula 3, and the sulfonimide compound comprising at least one fluorine is represented by Chemical Formula 4 or Chemical Formula 5:

Chemical Formula 3

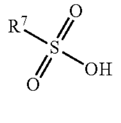

-continued

Chemical Formula 4

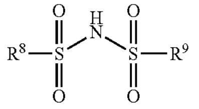

Chemical Formula 5

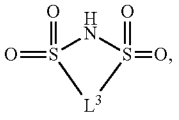

and wherein in Chemical Formula 3 to Chemical Formula 5, $R^7$ to $R^9$ are each independently a fluorine, a C1 to C20 alkyl group substituted with at least one fluorine, a C2 to C20 alkenyl group substituted with at least one fluorine, a C2 to C20 alkynyl group substituted with at least one fluorine, a C3 to C20 cycloalkyl group substituted with at least one fluorine, a C3 to C20 cycloalkenyl group substituted with at least one fluorine, a C3 to C20 cycloalkynyl group substituted with at least one fluorine, a C6 to C20 aryl group substituted with at least one fluorine, or a C1 to C20 heteroaryl group substituted with at least one fluorine, and $L^3$ is a C1 to C10 alkylene group substituted with at least one fluorine, a C3 to C20 cycloalkylene group substituted with at least one fluorine, a C6 to C20 arylene group substituted with at least one fluorine, or a C1 to C20 heteroarylene group substituted with at least one fluorine.

2. The method of claim 1, wherein the structural unit comprising the hydroxy group and fluorine is represented by Chemical Formula 1:

Chemical Formula 1

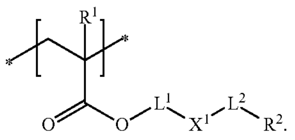

and wherein, in Chemical Formula 1, $R^1$ is hydrogen or a substituted or unsubstituted C1 to C10 alkyl group, $R^2$ is hydrogen, a fluorine, a hydroxy group, or a substituted or unsubstituted C1 to C20 alkyl group, $L^1$ and $L^2$ are each independently a single bond, or a substituted or unsubstituted C1 to C10 alkylene group, $X^1$ is a single bond, —O—, —S—, —S(O)—, $—S(O)_2—$, —C(O)—, —(CO)O—, —O(CO), —O(CO)O—, or —NR'—, wherein R' is hydrogen, deuterium, or a C1 to C10 alkyl group, $R^2$, $L^1$, and $L^2$ together comprise a fluorine and a hydroxy group, and

* is a linking point.

3. The method of claim 1, wherein the structural unit comprising the hydroxy group and fluorine is represented by Chemical Formula 2:

Chemical Formula 2

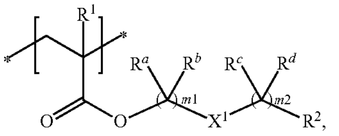

and wherein, in Chemical Formula 2, $R^1$ is hydrogen or a substituted or unsubstituted C1 to C10 alkyl group, $R^a$, $R^b$, $R^c$, $R^d$, and $R^2$ are each independently hydrogen, a fluorine, a hydroxy group, or a substituted or unsubstituted C1 to C20 alkyl group, m1 and m2 are each independently an integer from 1 to 10, $X^1$ is a single bond, —O—, —S—, —S(O)—, —$S(O)_2$—, —C(O)—, —(CO)O—, —O(CO), —O(CO)O—, or —NR'—, wherein R' is hydrogen, deuterium, or a C1 to C10 alkyl group, $R^a$, $R^b$, $R^c$, $R^d$, and $R^2$ together comprise a fluorine and a hydroxy group, and

* is a linking point.

4. The method of claim 1, wherein the structural unit comprising the hydroxy group and fluorine is at least one selected from Group I:

Group I

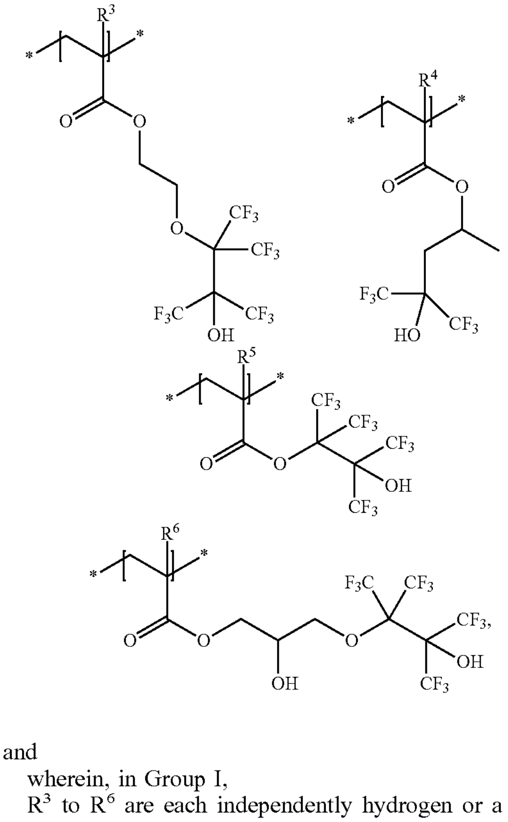

and wherein, in Group I, $R^3$ to $R^6$ are each independently hydrogen or a methyl group, and

* is a linking point.

5. The method of claim 1, wherein a weight average molecular weight of the acrylic polymer is about 1,000 g/mol to about 50,000 g/mol.

6. The method of claim 1, wherein the sulfonic acidic compound comprising at least one is at least one of compounds of Group II-1, and the sulfonimide compound comprising at least one fluorine is at least one of compounds of Group II-2:

Group II-1

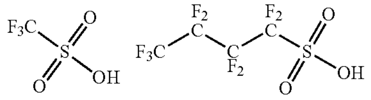

Group II-2

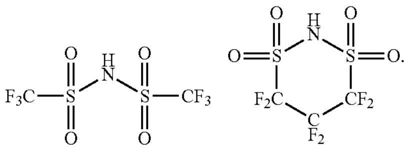

7. The method of claim 1, wherein the acrylic polymer and the acidic compound are included in a weight ratio of about 3:1 to about 30:1.

8. The method of claim 1, wherein a total weight of the acrylic polymer and the acidic compound is about 0.1 wt % to about 10 wt % based on a total weight of the organic topcoat composition.

9. The method of claim 1, wherein the rinse solution consists essentially of a combination of the ether-based compound and the alcohol-based compound.

10. The method of claim 9, wherein the rinse solution consists essentially of the ether-based compound and the alcohol-based compound in a weight ratio of about 0.5:1 to about 20:1.

11. The method of claim 1, wherein the ether-based compound is represented by Chemical Formula 7:

Chemical Formula 7

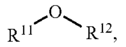

and wherein in Chemical Formula 7, $R^{11}$ and $R^{12}$ are each independently a substituted or unsubstituted C3 to C20 alkyl group.

12. The method of claim 1, wherein the ether-based compound is selected from diisopropyl ether, dipropyl ether, diisoamyl ether, diamyl ether, dibutyl ether, diisobutyl ether, di-sec-butyl ether, dihexyl ether, bis(2-ethylhexyl) ether, didecyl ether, diundecyl ether, didodecyl ether, ditetradecyl ether, hexadecyl ether, butylmethyl ether, butylethyl ether, butylpropyl ether, tert-butylmethyl ether, tert-butylethyl ether, tert-butylpropyl ether, di-tert-butyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, and a combination thereof.

13. A semiconductor device comprising:

a substrate on which a photoresist pattern manufactured according to the method of claim 1 is formed.

* * * * *